United States Patent [19]

Rossi et al.

[11] Patent Number: 5,241,226
[45] Date of Patent: Aug. 31, 1993

[54] CIRCUIT FOR SUPPRESSING THE NOISE PRODUCED BY SWITCHING BETWEEN TWO VOLTAGE SOURCES

[75] Inventors: Domenico Rossi, Cilavegna; Andrea Onetti, Pavia; Marco M. Monti, Milan, all of Italy

[73] Assignee: SGS-Thomson Microelectronics S.r.l., Italy

[21] Appl. No.: 805,494

[22] Filed: Dec. 11, 1991

[30] Foreign Application Priority Data

Dec. 11, 1990 [IT] Italy ................... 67990 A/90

[51] Int. Cl.$^5$ .................. H03K 5/00; H03K 5/07; H03K 17/04
[52] U.S. Cl. .................. 307/520; 307/542; 307/543; 307/521; 328/167
[58] Field of Search ............. 307/491, 520, 521, 542, 307/542.1, 543; 328/167; 330/9

[56] References Cited

U.S. PATENT DOCUMENTS

| | | | |
|---|---|---|---|
| 4,386,378 | 5/1983 | Guisinger | 360/46 |
| 4,405,901 | 9/1983 | Taguchi | 330/261 |
| 4,536,666 | 8/1985 | Metz et al. | 307/520 |
| 4,578,646 | 3/1986 | Maio et al. | 307/491 |
| 4,604,584 | 8/1986 | Kelley | 330/9 |
| 4,739,189 | 4/1988 | Kellogg | 330/9 |

FOREIGN PATENT DOCUMENTS 0043707 2/1981 European Pat. Off. .
2022949 5/1979 United Kingdom .

*Primary Examiner*—Timothy P. Callahan
*Attorney, Agent, or Firm*—Townsend and Townsend Khourie and Crew

[57] ABSTRACT

A circuit for suppressing the noise produced by the switching of two voltage sources having a direct current offset and connected alternately to the input of an amplification stage. The circuit comprises a low-pass filter between the two voltage sources and the amplification stage, which filter is normally disabled during normal operation of the amplification stage, and is only enabled during switching of the two voltage sources, so as to enable a gradual change in the direct voltage supplied to the input of the amplification stage and due to the offset between the two sources.

7 Claims, 2 Drawing Sheets

CIRCUIT FOR SUPPRESSING THE NOISE PRODUCED BY SWITCHING BETWEEN TWO VOLTAGE SOURCES

BACKGROUND OF THE INVENTION

The present invention relates to a circuit for suppressing the noise produced by the switching of two voltage sources having a direct-current offset, particularly for audio preamplification stages.

A typical application of the present circuit is he autoreverse amplification stage for preamplifying signals from the magnetic head of tape recorders. An example of such an audio stage is shown in FIG. 4, in which the preamplification stage comprises an equalizing network for amplifying solely within the 20 Hz to 20 KHz audio frequency range.

In FIG. 4, the two sources are represented by three sources: source 1 for producing a first alternating-voltage signal $v_{in1}$ having no direct current offset; source 2 for producing a second alternating-voltage signal $v_{in2}$ having no direct current offset; and source 3, series connected to source 2, for producing the direct current offset voltage $V_{off}$ between the two sources. Sources 1 on the one hand and 2 and 3 on the other are connected between ground and a common point 13 by respective switches 4 and 5, which, during operation of the stage, are alternately closed. Point 13 is in turn connected to the non-inverting input of an operational amplifier 6 defining the preamplification stage together with equalizing network 7. Network 7 comprises a first line consisting of a resistor 8; a second line consisting of the series connection of resistor 9 and condenser 10, both lines being connected parallel between the output and inverting input of amplifier 6; and a third line 14 consisting of the series connection of resistor 11 and condenser 12, and connected between the same inverting input and ground.

When dc operated, the two condensers function as an open circuit, so that the stage gain is unitary. When, on the other hand, the frequency of the input signal ($v_{in1}$ or $v_{in2}$, depending on which of switches 4 and 5 is closed) exceeds the lower cutoff frequency $1/(2\pi * R_1 * C_1)$, where $R_1$ is the resistance of resistor 11 and $C_1$ the capacitance of condenser 12, the signal at the non-inverting input of amplifier 6 is amplified.

The values of components 11 and 12 are normally selected so that the lower cutoff frequency is slightly less than the lowest audio frequency.

In a stage of the aforementioned type, switching of the input voltages produces a spurious transient state at the output of amplifier 6, which, in the case of audio applications, is unacceptable.

One known solution consists in dc decoupling of the two signal sources from the multiplexed input of amplifier 6. For this purpose, as shown in FIG. 5, provision is made, between sources 1 and 2 and respective switches 4 and 5, for a first and second high-pass filter, each consisting of a decoupling condenser 15, 16 and a decoupling resistor 17, 18. In this case, the time constants of the two filters 15, 17 and 16, 18 must be high enough to also permit the passage of the lowest audio signal frequency (in this case 20 Hz). This can be achieved in two ways: using a high-capacitance condenser 15, 16 and a resistor 17, 18 of not too high a value, or vice versa.

The first solution, though technically good in that, during normal operation, resistor 17, 18 produces very little noise at the output of amplifier 6, is expensive by requiring the use of non-integratable electrolytic condensers.

The second, though more economical, results in a high noise level at the output.

An alternative noise suppression solution consists in operating downstream from the amplifier, by providing a switch at the output of amplifier 6, controlled in such a manner as to prevent the passage of the signal during the transient state produced by switching of the voltages, but which lets the signal through during normal operation. This is shown in FIG. 6 in which the output of amplifier 6 is connected by a switch 20 to a high-pass filter comprising a decoupling condenser 21 and a decoupling resistor 22. Downstream from filter 21, 22, provision is also made for a buffer stage 23. One terminal of resistor 22 is biazed to a reference voltage $V_{REF}$. Thus, stage output $V_O$ is biazed to the reference voltage during the transient state, while buffer 23 receives and supplies the amplified audio signal during normal operation.

The above solution, however, also presents a number of drawbacks in terms of complex design and cost, due to the need, once more, for a decoupling condenser; the presence of two additional pins (squares 24 in FIG. 6); and the use of an output buffer stage. A further drawback is posed by the necessity of referring the two sources (1-3), which are external components, to reference voltage $V_{REF}$. If this were not so, i.e. if the input signals were referred to ground, condenser 21 would have to be charged to reference voltage $V_{REF}$, which would result in a further transient state when switch 20 is closed.

SUMMARY OF THE INVENTION

It is an object of the present invention to provide a noise suppressing circuit of the aforementioned type, designed to overcome the drawbacks typically associated with known circuits, i.e. which comprises readily integratable components; requires no additional pins; in no way impairs performance in terms of the signal/-noise ratio; and introduces no additional transient states other than that inevitably caused by switching of the two sources.

According to the present invention, there is provided a circuit for suppressing the noise produced by the switching of two voltage sources having a direct current offset, particularly for audio preamplification stages, and as defined in claim 1.

BRIEF DESCRIPTION OF THE DRAWINGS

A preferred, non-limiting embodiment of the present invention will be described by way of example with reference to the accompanying drawings, in which:

FIG. 3 shows two graphs of two signals in FIG. 2a;

DETAILED DESCRIPTION OF THE INVENTION

Figure 1:
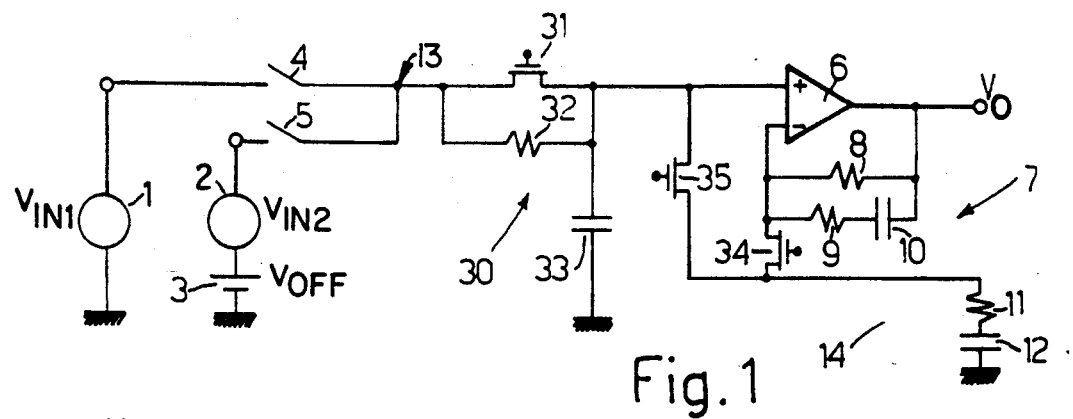
FIG. 1 shows a simplified electric diagram of the circuit according to the present invention as applied to an audio preamplification stage.
Figure 4:
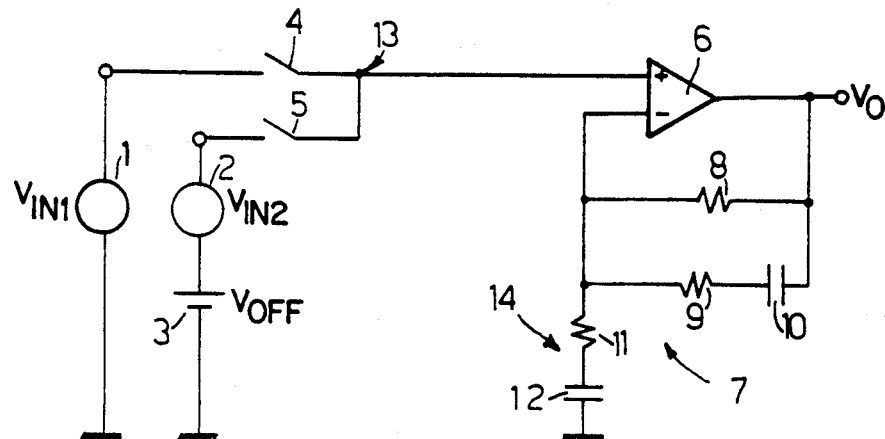
FIG. 4 shows a simplified electric diagram of a typical application of the circuit according to the present invention.
Figure 5:
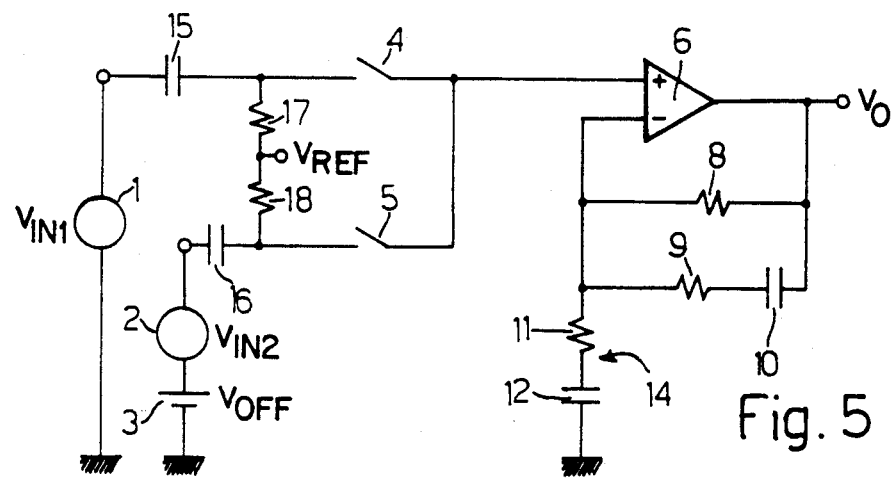
FIGS. 5 and 6 show two known noise suppression solutions relative to the FIG. 4 circuit.
Figure 6:
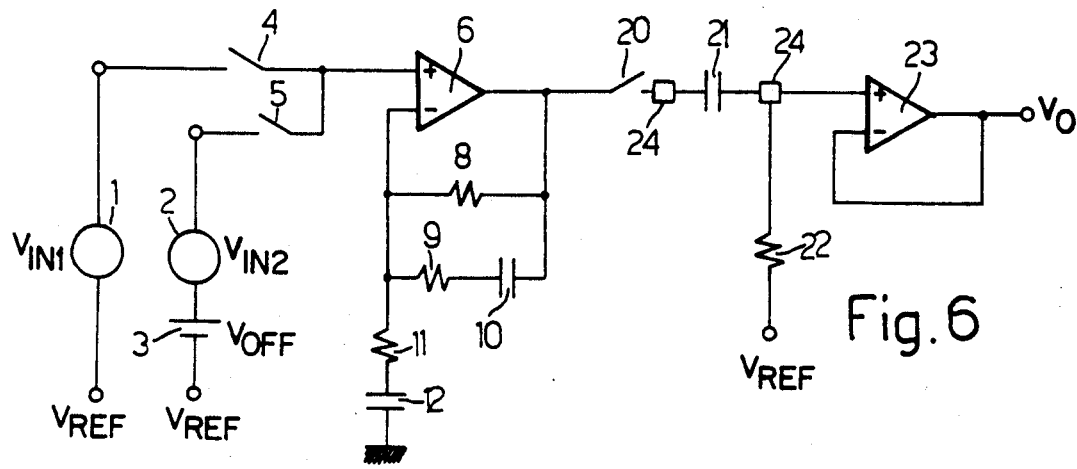

In FIG. 1, the noise suppressing circuit is applied to an audio preamplification stage supplied by two sources, as described with reference to FIG. 4. The components common to both diagrams are therefore indicated using the same numbering system.

FIG. 1 presents sources 1-3 of voltages $v_{in1}$, $v_{in2}$ and $V_{off}$ connected between ground and a common point 13 by respective switches 4 and 5. In this case also, amplifier 6 is connected to a feedback network 7 comprising components 8-12.

According to the present invention, between point 13 and the non-inverting input of amplifier 6 of the preamplification stage, there is provided a low-pass filter, which is only enabled during the transient state caused by switching of the voltages, for enabling a gradual increase or reduction in the direct signal due to the offset between the two signal sources and supplied to the input of amplifier 6. During normal operation of the amplification stage, the filter is disabled (short-circuited) by means of switches.

In the embodiment shown, the filter consists of an RC branch 30, controlled by switch 31, and feedback line 14 of amplifier 6, controlled by switches 34 and 35. Branch 30 comprises a resistor 32 between point 13 and the non-inverting input of amplifier 6, and parallel to switch 31; and a condenser 33 connected between the non-inverting input and ground (reference potential line). Switch 34 is located between the inverting input of amplifier 6 and line 14, including resistor 11 and condenser 12, and switch 35 between the non-inverting input of amplifier 6 and line 14.

Figure 2A:
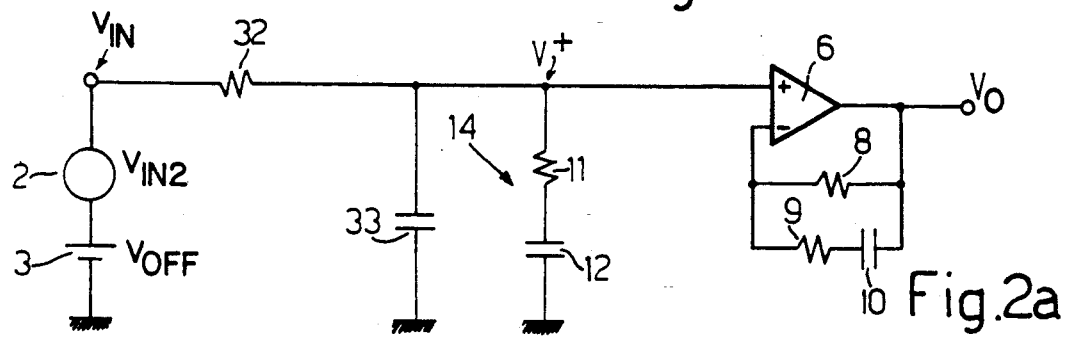
FIGS. 2a and 2b show two diagrams of the FIG. 1 circuit in two different operating states.
Figure 2B:
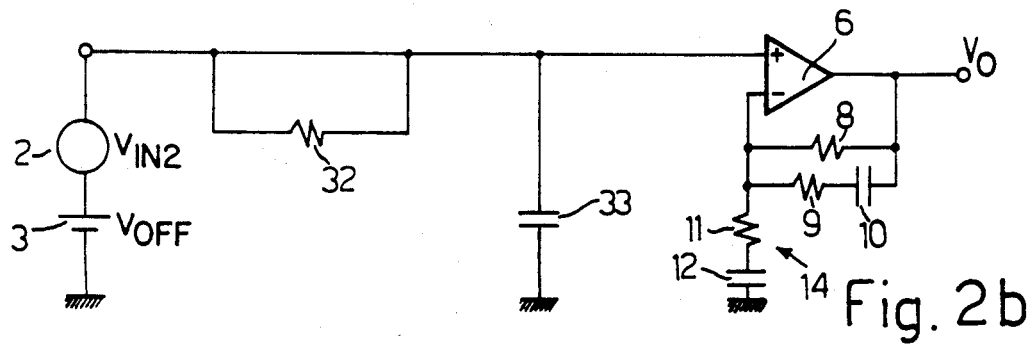

Switches 31, 34 and 35, which consist of CMOS transistors, are so controlled as to open or close during the source switching phase. That is, during normal operation of the preamplification stage, switches 31 and 34 are closed and switch 35 open. Vice versa, during the switching phase of signals $v_{in1}$ and $v_{in2}$, switches 31 and 34 are open and switch 35 closed. Operation of the circuit will now be described with reference to FIGS. 2a, 2b and 3. Suppose signal $v_{in1}$ is being supplied to amplifier 6 and we wish to effect a switch for supplying the amplifier with $v_{in2}$. To do this, switch 4 is opened and switch 5 closed, so that signal $v_{in2}$ and offset voltage $V_{off}$ are now present at point 13. At the same time, or only slightly in advance, switches 31 and 34 are opened and switch 35 closed. The resulting circuit is as shown in FIG. 2a, wherein branch 30 is between source $v_{in2} + V_{off}$ and the non-inverting input of amplifier 6; line 14 is connected between the same non-inverting input and ground; and amplifier 6 is fed back entirely as a buffer by components 8-10 (thus presenting a unit gain).

Figure 3:
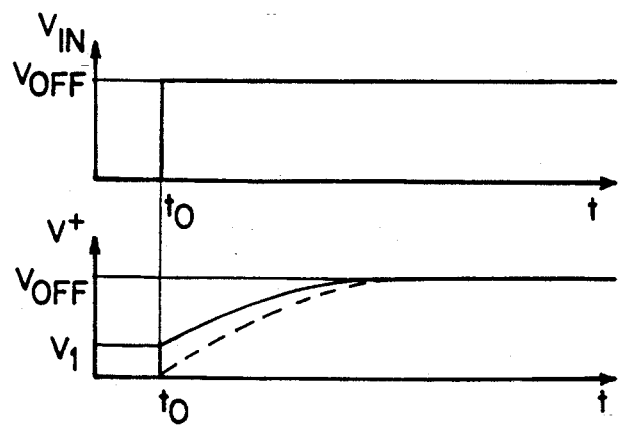

The low-pass filter consisting of components 11, 12, 32 and 33 therefore filters the input signal, by converting the step due to insertion of the offset voltage into a slow signal having no irritating high-level harmonics. The obtainable response is shown in FIG. 3, which shows the step graph of the direct current offset $V_{IN}$ of the input signal, which goes from 0 to $V_{off}$, and two graphs of voltage V+ at the non-inverting input of amplifier 6: without condenser 33 (continuous line) and with condenser 33 (dotted line).

In more detail, in the absence of condenser 33, the step in $V_{IN}$ is accompanied by a step in V+ having a value $V_{off}*R_1/(R_1+R_2)$, where $R_1$ and $R_2$ are the respective resistances of resistors 11 and 32. Subsequently, voltage V+ increases gradually, with a time constant $(R_1+R_2)*C_1$, where $C_1$ is the capacitance of condenser 12, up to $V_{off}$, whereas, in the presence of condenser 33, V increases gradually from zero to $V_{off}$. Thus, the input signal of amplifier 6 gradually reaches the offset value, to which condenser 12 is also charged. At this point (transient state concluded) switches 31, 34 and 35 switch once more to produce the circuit shown in FIG. 2b, wherein, under normal operating conditions, resistor 32 is short-circuited, and branch 14 is again connected between the inverting input of amplifier 6 and ground. Consequently, signal $v_{in2}$ is supplied to the input of amplifier 6 by which it is amplified in the normal way. When switching from the second to the first source (from $v_{in2}$ to $v_{in1}$), filter 11, 12, 32, 33 obviously operates the opposite way, by gradually reducing the direct voltage at the input of amplifier 6 from $V_{off}$ to zero, while at the same time discharging condensers 12, 33.

The advantages of the FIG. 1 circuit will be clear from the foregoing description. Firstly, the low-pass filter consisting of components 11, 12, 32 and 33, and which provides for slowly increasing or reducing the direct signal at the non-inverting input of the amplifier, fully eliminates any noise caused by switching of the voltage sources. Secondly, by virtue of condenser 12 being charged to the offset voltage at the end of the transient state caused by $v_{in1}$ switching to $v_{in2}$, and being discharged upon $v_{in2}$ switching to $v_{in1}$, any problems caused by further transient states are eliminated with no need for varying the references of the various internal or external components.

The fact that resistor 32 is short-circuited during normal operation of the stage enables the use of a high-value component, with no risk of impairing the signal/noise ratio, and appropriate sizing of condenser 33, which may thus present a low value, readily integratable, for example, in MOS technology, and such as to create no alternating problems as regards the useful audio signal. The same technology may also be employed to advantages for the switches, for preventing the introduction of a direct current offset. As such, the circuit shown is particularly suitable for bipolar-CMOS technology applications in which bipolar technology is employed for low noise level amplification.

Finally, the circuit shown requires no a.c. coupling or additional pins.

To those skilled in the art it will be clear that changes may be made to the circuit described and illustrated herein without, however, departing from the scope of the present invention.

We claim:

1. A circuit for suppressing the noise produced by the switching of two voltage sources (1-3) having a direct current offset and connected alternatively to a first input of an amplification stage (6, 7), particularly an audio preamplification stage;

characterized by low-pass filter means (11, 12, 32, 33) coupled to said voltage sources (1-3) and said first input and control means (31, 34, 35) for enabling said filter means during a transient state produced by switching between said two voltage sources, and disabling said filter means during normal operation of said amplification stage wherein said amplification stage comprises an amplifying element (6) having said first input a second input, and an output, with a feedback network (7) coupled to said output and said first input;

said voltage sources (1-3) being connected alternately to said second input; and said feedback network (7) comprising a capacitance branch (14) coupled to said first input and a reference potential line;

said feedback network characterized by the fact that it comprises a first switch (34) coupled to said second input and said capacitance branch (14), and a second switch (35) coupled to said first input and said capacitance branch (14);

said first and second switches being so controlled as to connect said capacitance branch to said second input during said transient state caused by switching of said voltage sources, and to connect said capacitance branch to said first input during normal operation.

2. A circuit as claimed in claim 1, characterized by the fact that said switches (31, 34, 35) are CMOS switches.

3. A circuit for suppressing noise produced by switching between first and second voltage sources, said noise suppression circuit comprising:

an amplifier having an input;

switching means, coupled to the first and the second voltage sources, for switching between the first and the second voltage sources thereby producing a transient state;

filter means, coupled to said switching means, for producing a ramped voltage response during said transient state so that when said switch means switches between the first and the second voltage sources, said ramped voltage response is input to said amplifier input;

control means, coupled to said switch means, said filter means, and said amplifier input, for enabling said filter means during said transient state and disabling said filter means when operation of the noise suppression circuit is not in said transient state.

4. The noise suppression circuit of claim 3, wherein said filter means includes an RC filter.

5. The noise suppression circuit of claim 3, wherein:

said filter means comprises a resistor coupled to said switching means and said amplifier input, a capacitor coupled to said amplifier input and a reference potential line; and said control means comprises a switch connected in parallel to said resistor, said switch being open when the noise suppression circuit is not in said transient state and closed when the noise suppression circuit is in said transient state.

6. The noise suppression circuit of claim 5, wherein said switch is a CMOS switch.

7. The noise suppression circuit of claim 3, wherein:

the first voltage source and the second voltage source are connected at a common point by said switching means; and said filter means is connected to said common point and said amplifier input.

* * * * *